United States Patent
Chen et al.

(10) Patent No.: US 8,064,848 B2
(45) Date of Patent: Nov. 22, 2011

(54) TRANSMITTER AND CONTROL METHOD FOR TRANSMITTING AND CALIBRATING A PHASE SIGNAL AND AN AMPLITUDE SIGNAL

(75) Inventors: Hsin-Hung Chen, Miaoli County (TW); Hsiang-Hui Chang, Taipei Hsien (TW); Chun-Pang Wu, Kaohsiung (TW)

(73) Assignee: MediaTek Inc., Hsin-Chu (TW)

( * ) Notice: Subject to any disclaimer, the term of this patent is extended or adjusted under 35 U.S.C. 154(b) by 524 days.

(21) Appl. No.: 12/258,647

(22) Filed: Oct. 27, 2008

(65) Prior Publication Data
US 2010/0105341 A1    Apr. 29, 2010

(51) Int. Cl.
*H04B 1/66* (2006.01)
(52) U.S. Cl. ........................................................ 455/102
(58) Field of Classification Search .................. None
See application file for complete search history.

(56) References Cited

U.S. PATENT DOCUMENTS

| | | | |
|---|---|---|---|
| 5,767,750 A * | 6/1998 | Yamaji | 332/103 |
| 7,346,122 B1 * | 3/2008 | Cao | 375/296 |
| 2006/0067427 A1 | 3/2006 | Zolfaghari et al. | |
| 2006/0246856 A1 * | 11/2006 | Udagawa et al. | 455/108 |
| 2007/0183532 A1 | 8/2007 | Matero | |
| 2009/0291648 A1 * | 11/2009 | Lee | 455/102 |

* cited by examiner

*Primary Examiner* — Lincoln Donovan
*Assistant Examiner* — Sibin Chen
(74) *Attorney, Agent, or Firm* — Thomas|Kayden

(57) ABSTRACT

A transmitter for transmitting and calibrating a phase signal and an amplitude signal. The transmitter comprises a phase modulation path, an amplitude modulation path, and a control unit. The phase modulation path transmits the phase signal. The amplitude modulation path transmits the amplitude signal. The control unit delays the signal on at least one of the phase modulation path and the amplitude modulation.

32 Claims, 10 Drawing Sheets ern and a control method, and more particularly to a transmitter and a control method for transmitting and calibrating a phase signal and an amplitude signal.

TRANSMITTER AND CONTROL METHOD FOR TRANSMITTING AND CALIBRATING A PHASE SIGNAL AND AN AMPLITUDE SIGNAL

BACKGROUND OF THE INVENTION

1. Field of the Invention

The invention relates to a transmitter and a control method, and more particularly to a transmitter and a control method for transmitting and calibrating a phase signal and an amplitude signal.

2. Description of the Related Art

FIG. 1 is a schematic diagram of a conventional transmitter. The conventional transmitter 100 comprises mixers 110, 120, a local oscillator (LO) 130, an adder 140, a power amplifier 150, a surface acoustic wave (SAW) 160, and an antenna 170. The mixer 110 mixes I digital baseband data $S_I$ with a first carrier provided by the LO 130. The mixer 120 mixes Q digital baseband data $S_Q$ with a second carrier provided by the LO 130. The phase difference of the first carrier and the second carrier is 90°. The adder 140 adds the mixed signals. The power amplifier 150 amplifies the output signal of the adder 140. The SAW 160 processes the amplified signal and transmits the processed result via the antenna 170.

BRIEF SUMMARY OF THE INVENTION

Transmitters are provided. An exemplary embodiment of a transmitter, which transmits and calibrates a phase signal and an amplitude signal, comprises a phase modulation path, an amplitude modulation path, and a control unit. The phase modulation path transmits the phase signal. The amplitude modulation path transmits the amplitude signal. The control unit delays the signal on at least one of the phase modulation path and the amplitude modulation path.

Another exemplary embodiment of a transmitter comprises a first filter, a second filter, and a control unit. The first filter generates a phase signal according to a first signal. The second filter generates an amplitude signal according to a second signal. The control unit delays at least one of the first and the second signals.

A control method for a transmitter is provided. An exemplary embodiment of a control method for transmitting and calibrating a phase signal and an amplitude signal is described in the following. A phase modulation path is provided for transmitting the phase signal. An amplitude modulation path is provided for transmitting the amplitude signal. The signal on at least one of the phase modulation path and the amplitude modulation path is delayed.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
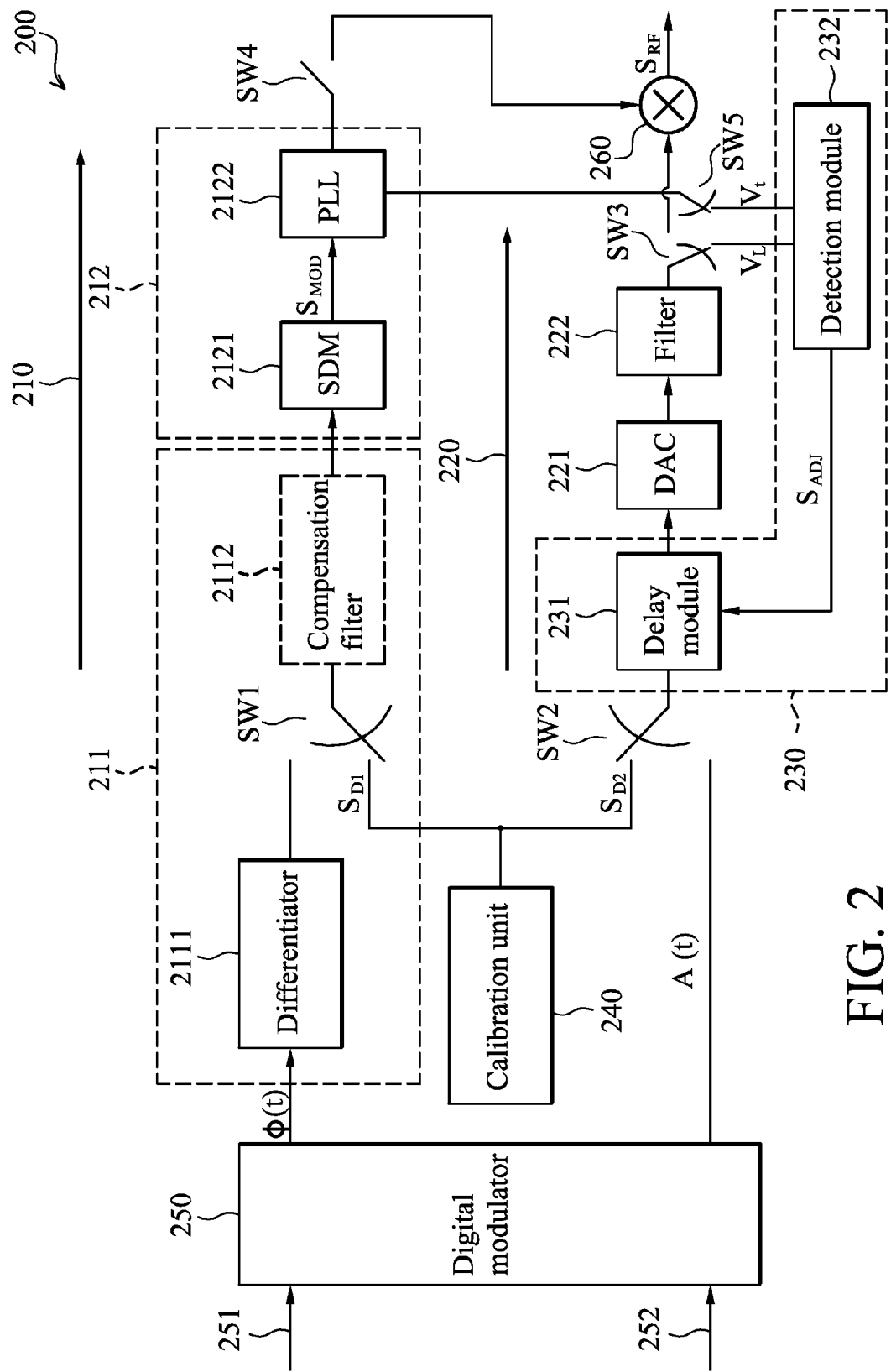
FIG. 2 is a schematic diagram of an exemplary embodiment of a transmitter.

FIG. 2 is a schematic diagram of an exemplary embodiment of a polar transmitter. The transmitter 200 is capable of transmitting and calibrating a phase signal $\phi(t)$ and an amplitude signal A(t). In this embodiment, the transmitter 200 comprises a phase modulation path 210, an amplitude modulation path 220, and a control unit 230. The phase modulation path 210 transmits the phase signal $\phi(t)$. The amplitude modulation path 220 transmits the amplitude signal A(t). The control unit 230 delays the signal on at least one of the phase modulation path 210 and the amplitude modulation path 220.

The transmitter 200 further comprises a calibration unit 240 and a digital modulator 250. In a calibration mode, the calibration unit 240 provides a calibration signal $S_{D1}$ to the phase modulation path 210 and provides a calibration signal $S_{D2}$ to the amplitude modulation path 220. In this embodiment, the calibration signal $S_{D1}$ is the same as the calibration signal $S_{D2}$.

Different delays may be introduced on the phase modulation path 210 and the amplitude modulation path 220, resulting in delay mismatch between the output signals. In the calibration mode, the control unit 230 is utilized to detect the difference of delay between the calibration signals $S_{D1}$ and $S_{D2}$ that have passed through the two paths 210 and 220. In one embodiment, the control unit 230 adjusts a delay factor according to the difference between the calibration signals $S_{D1}$ and $S_{D2}$ such that the signal on at least one of the phase modulation path 210 and the amplitude modulation path 220 is delayed. Since delay on at least one of the phase modulation path 210 and the amplitude modulation path 220 is compensated, the signals on the phase modulation path 210 and the amplitude modulation path 220 are synchronous. When the calibration signals $S_{D1}$ and $S_{D2}$ are synchronous, the control unit 230 stops detecting the difference between the calibration signals $S_{D1}$ and $S_{D2}$ and maintains the delay factor.

In a normal mode, the digital modulator 250 converts I digital baseband data 251 and Q digital baseband data 252 into the phase signal $\phi(t)$ and the amplitude signal A(t). The phase modulation path 210 transmits the phase signal $\phi(t)$. The amplitude modulation path 220 transmits the amplitude signal A(t). Since the delay factor of the control unit 230 is adjusted, the phase signal $\phi(t)$ and the amplitude signal A(t) can simultaneously arrive to a combiner 260 in the normal mode. The combiner 260 combines the phase signal $\phi(t)$ and the amplitude signal A(t) to generate a radio frequency (RF) signal $S_{RF}$.

The control unit 230 comprises a delay module 231 and a detection module 232. In the calibration mode, the detection module 232 detects the difference of delays between the signals on the phase modulation path 210 and the amplitude modulation path 220 and generates an adjustment signal $S_{ADJ}$ according to the detection result. When the signals on the phase modulation path 210 and the amplitude modulation path 220 are synchronous, the detection module 232 stops detecting the difference and maintains the adjustment signal $S_{ADJ}$. The delay module 231 delays the signal on at least one of the phase modulation path 210 and the amplitude modulation path 220 according to the adjustment signal $S_{ADJ}$. In this embodiment, the delay module 231 delays the signal on the amplitude modulation path 220 according to the adjustment signal $S_{ADJ}$.

Generally, delay is easily introduced by a filter. In this embodiment, the detection module 232 detects the output signal $V_t$ of a filter (not shown) disposed on the phase modulation path 210 and the output signal $V_L$ of a filter (such as 222) disposed on the amplitude modulation path 220.

Figure 3A:
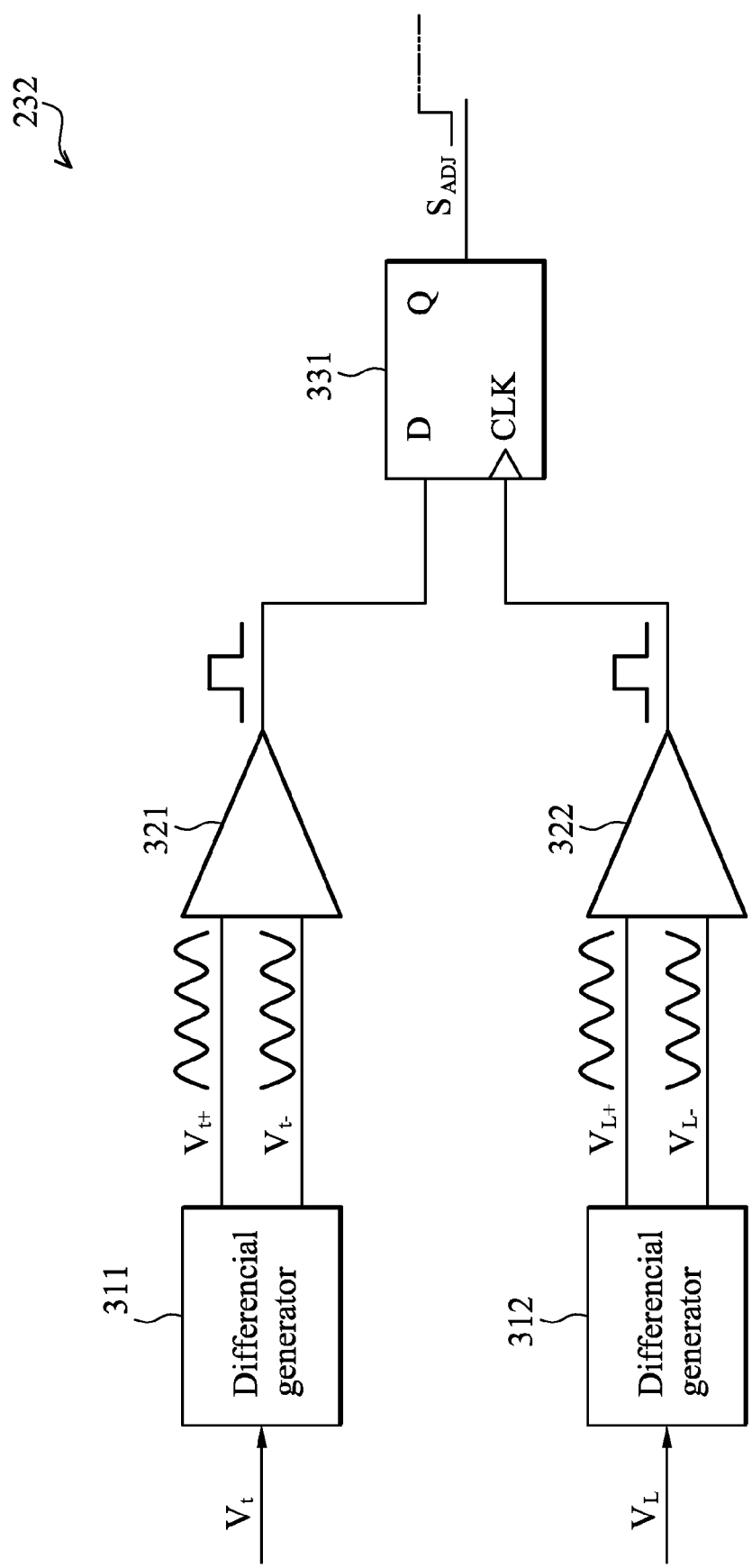
FIG. 3A is a schematic diagram of an exemplary embodiment of the detection module.

FIG. 3A is a schematic diagram of an exemplary embodiment of the detection module. The detection module 232 comprises differential generators 311, 312, comparators 321, 322, and a flip-flop 331. The differential generator 311 transmits the output signal $V_L$ into differential signals $V_{L+}$ and $V_{L-}$. The differential generator 312 transmits the output signal $V_t$ into differential signals $V_{t+}$ and $V_{t-}$. The differential signals $V_{L+}$ and $V_{L-}$ refer to a first differential pair. The differential signals $V_{t+}$ and $V_{t-}$ refer to a second differential pair. The comparator 321 compares the differential signals $V_{t+}$ and $V_{t-}$ and transmits the compared result to the flip-flop 331. The comparator 322 compares the differential signals $V_{L+}$ and $V_{L-}$ and transmits the compared result to the flip-flop 331. The flip-flop 331 generates the adjustment signal $S_{ADJ}$ according to the compared results.

In this embodiment, the flip-flop 331 is a D-type flip-flop. The output signal of the comparator 321 is transmitted to the input terminal D of flip-flop 331. The output signal of the comparator 322 is transmitted to the clock terminal CLK of flip-flop 331. When the output signal of the comparator 322 is changed from a low level to a high level, the adjustment signal $S_{ADJ}$ follows the output signal of the comparator 321.

Figure 3C:
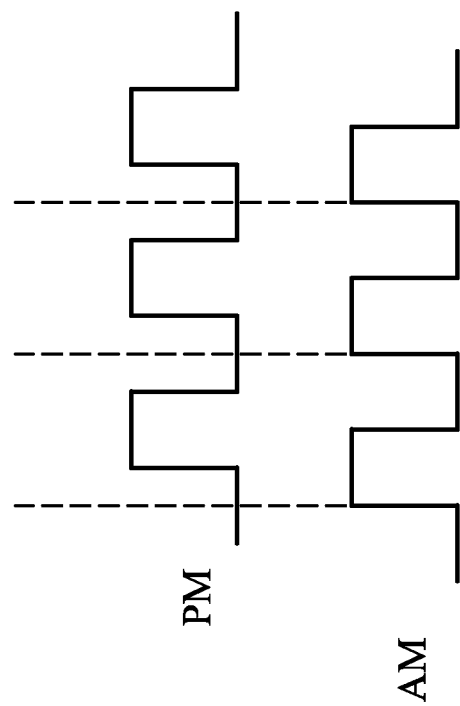
FIG. 3C is a waveform diagram of another exemplary embodiment of the output signals of the comparators 321 and 322.
Figure 3B:
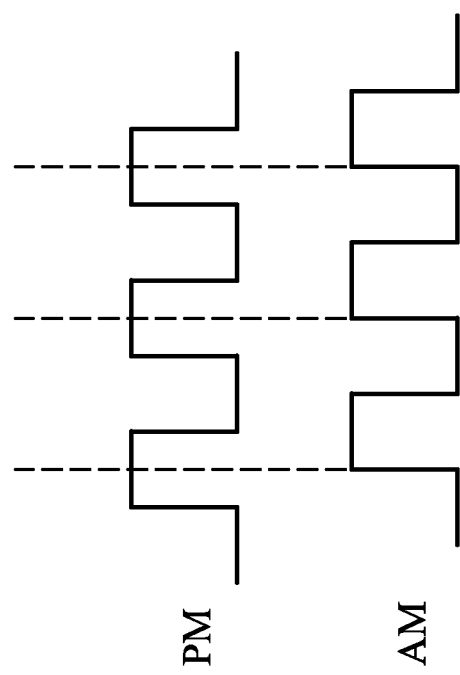
FIG. 3B is a waveform diagram of an exemplary embodiment of the output signals of the comparators 321 and 322.

FIG. 3B is a waveform diagram of an exemplary embodiment of the output signals of the comparators 321 and 322. The label PM shown in FIG. 3B represents the output signal of the comparator 321 and the label AM represents the output signal of the comparator 322. When the output signal of the comparator 322 is changed from a low level to a high level, since the output signal of the comparator 321 is at a high level, the output signal (such as adjustment signal $S_{ADJ}$) of flip-flop 331 is at a high level. Referring to FIG. 3C, when the output signal of the comparator 322 is changed from the low level to the high level, since the output signal of the comparator 321 is at a low level, the output signal of flip-flop 331 is at a low level.

Figure 3D:
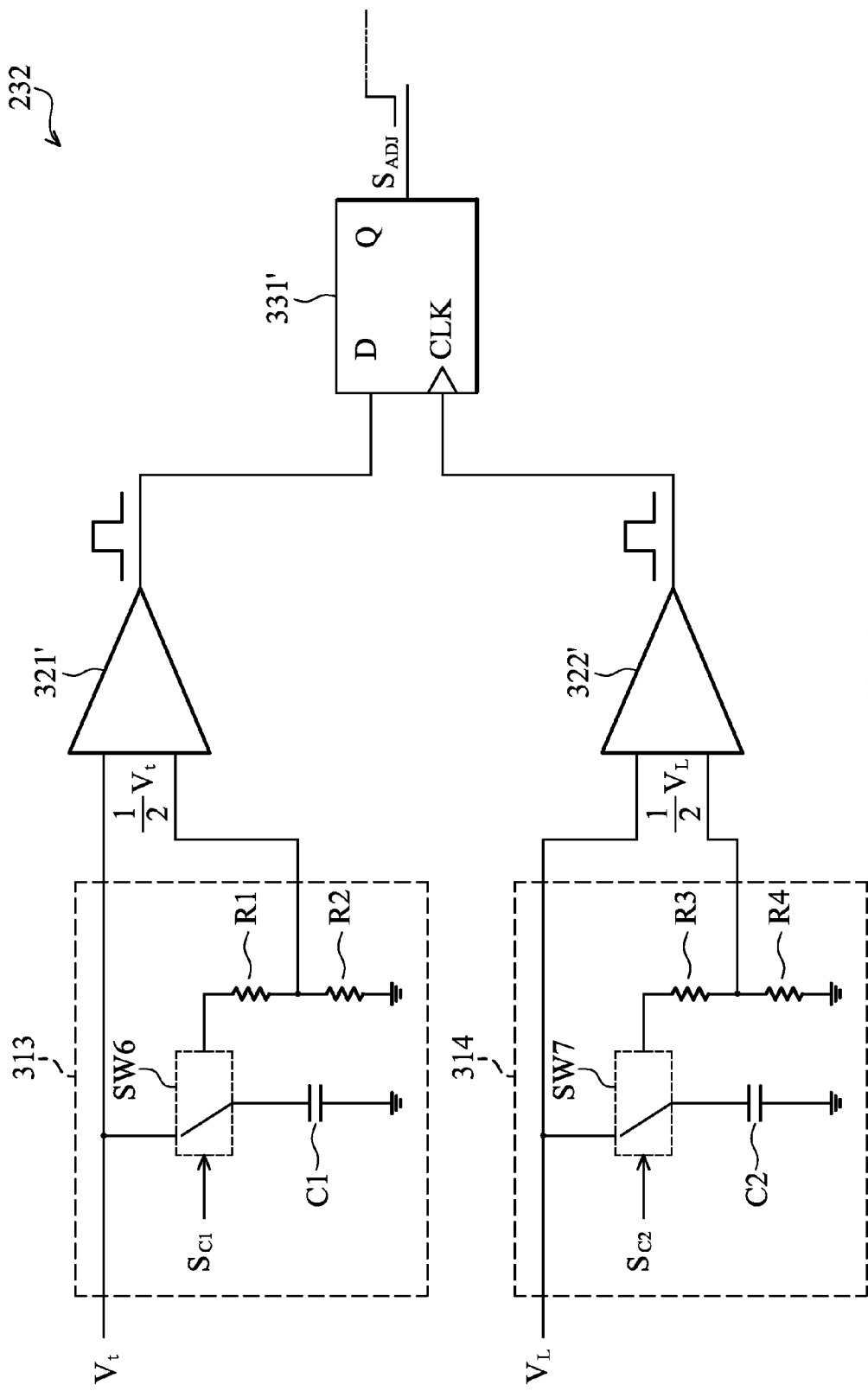
FIG. 3D is a schematic diagram of another exemplary embodiment of the detection module.

FIG. 3D is a schematic diagram of another exemplary embodiment of the detection module. The detection module 232 comprises voltage generators 313 and 314, comparators 321' and 322', and a flip-flop 331'. The voltage generator 313 receives the output signal $V_t$ and generates a divided signal $$\frac{1}{2}V_t.$$

The comparator 321' compares the output signal $V_t$ and a divided signal $$\frac{1}{2}V_t.$$

The divided signal $$\frac{1}{2}V_t$$

is served as a threshold voltage such that comparator 321' converts the output signal $V_t$ from a sine wave to a rectangular wave. The voltage generator 314 receives the output signal $V_L$ and generates the divided signal $$\frac{1}{2}V_L.$$

The comparator 322' compares the output signal $V_L$ and the divided signal $$\frac{1}{2}V_L.$$

The divided signal $$\frac{1}{2}V_L$$

is served as a threshold voltage such that comparator 322' converts the output signal $V_L$ from a sine wave to a rectangular wave. The flip-flop 331 generates the adjustment signal $S_{ADJ}$ according to the compared results of the comparators 321' and 322'.

In this embodiment, the voltage generator 313 comprises a switch SW6, a capacitor C1, and resistors R1 and R2, but is not limited. The switch SW6 is controlled by a control signal $S_{C1}$ such that the capacitor C1 receives the output signal $V_t$ or the capacitor C1 is connected to the resistors R1 and R2 in parallel. First, the output signal $V_t$ is transmitted to the capacitor C1. Then, the capacitor C1 is connected to the resistors R1 and R2. Since the resistors R1 and R2 are connected to act as a voltage divider, the divided signal $$\frac{1}{2}V_t$$

is generated.

Similarly, the voltage generator 314 comprises a switch SW7, a capacitor C2, and resistors R3 and R4, but is not limited. The switch SW7 is controlled by a control signal $S_{C2}$ such that the capacitor C2 receives the output signal $V_L$ or the capacitor C2 is connected to the resistors R3 and R4 in parallel. First, the output signal $V_L$ is transmitted to the capacitor C2. Then, the capacitor C2 is connected to the resistors R3 and R4. Since the resistors R3 and R4 are connected to act as a voltage divider, the divided signal is generated.

Referring to FIG. 2, in the calibration mode, the phase modulation path 210 refers to the path from the compensation filter 2112 to the SDM 2121 and the PLL 2122. In the normal mode, the phase modulation path 210 can further include the differentiator 2111. In this embodiment, the differentiator 2111 and the compensation filter 2112 are included in a process unit 211. The process unit 211 can enhance certain high frequency portion of the signal on the phase modulation path 210 by the compensation filter 2122. In the normal mode, the differentiator 2111 differentiates the phase signal φ(t) and the compensation filter 2112 enhances certain high frequency portion of the signal on the phase modulation path 210. In the calibration mode, the compensation filter 2112 enhances certain high frequency portion of the calibration signal $S_{D1}$. In some embodiments, the compensation filter 2112 can be omitted.

In this embodiment, the fractional-N PLL 212 comprises a sigma-delta modulator (SDM) 2121 and a phase-locked loop (PLL) 2122. The SDM 2121 modulates the output signal of the process unit 211 to generate a modulated signal $S_{MOD}$. The PLL 2122 operates according to the modulated signal $S_{MOD}$.

Figure 4:
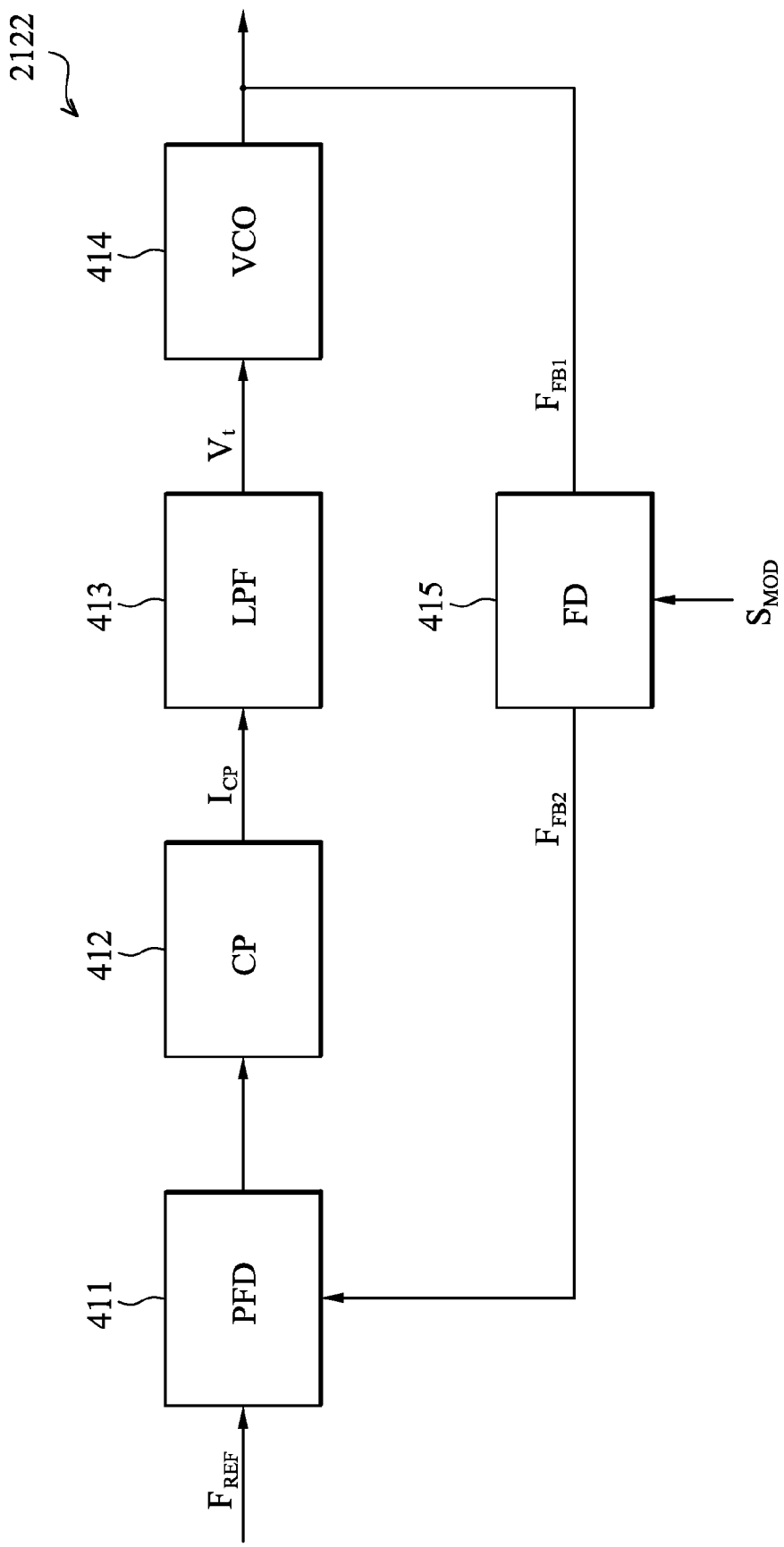
FIG. 4 is a schematic diagram of an exemplary embodiment of a PLL.

FIG. 4 is a schematic diagram of an exemplary embodiment of a PLL. The PLL 2122 comprises a phase-frequency detector (PFD) 411, a charge pump (CP) 412, a low pass filter (LPF) 413, a voltage control oscillator (VCO) 414, and a frequency divider (FD) 415. The PFD 411 detects the phase difference between a reference frequency $F_{REF}$ and a feedback frequency $F_{FB2}$. The CP 412 transforms the phase difference into a pump current $I_{CP}$. The LPF 413 transforms the pump current $I_{CP}$ into the output signal $V_t$. The VCO 414 generates a feedback frequency $F_{FB1}$ according to the output signal $V_t$. The FD 415 divides the feedback frequency $F_{FB1}$ according to the modulated signal $S_{MOD}$ to generate the feedback frequency $F_{FB2}$. The detection module 232 detects the output signal $V_t$ of the LPF 413 to obtain the amount of delay of phase modulation path.

Referring to FIG. 2, the amplitude modulation path 220 comprises a digital-to analog converter (DAC) 221 and a filter 222. The DAC 221 transforms the signal on the amplitude modulation path 220, and then the signal is filtered by the filter 222. In the calibration mode, the DAC 221 transforms the calibration signal $S_{D1}$ and the filter 222 filters the transformed calibration signal to generate the output voltage $V_L$. In the normal mode, the DAC 221 transforms the amplitude signal and the filter 222 filters the transformed amplitude signal.

Referring to FIG. 2, in one embodiment, the transmitter 200 can have switches SW1~SW5. In the calibration mode, the switches SW1 and SW2 switch to the calibration unit 240 such that the phase modulation path 210 receives the calibration signal $S_{D1}$ and the amplitude modulation path 220 receives the calibration signal $S_{D2}$. In this mode, the switch SW3 switches to the detection module 232 such that the output voltage $V_L$ is transmitted to the detection module 232. The SW4 is turned off and the SW5 is turned on such that the output voltage $V_t$ is transmitted to the detection module 232.

In the normal mode, the switches SW1 and SW2 switch to the digital modulator 250 such that the phase modulation path 210 and the amplitude modulation path 220 respectively receive the phase signal φ(t) and the amplitude signal A(t). At this time, the switch SW3 switches to the combiner 260. The SW4 is turned on and the SW5 is turned off. Thus, the combiner 260 receives and combines the signals on the phase modulation path 210 and the amplitude modulation path 220 to generate the RF signal $S_{RF}$.

Figure 1:
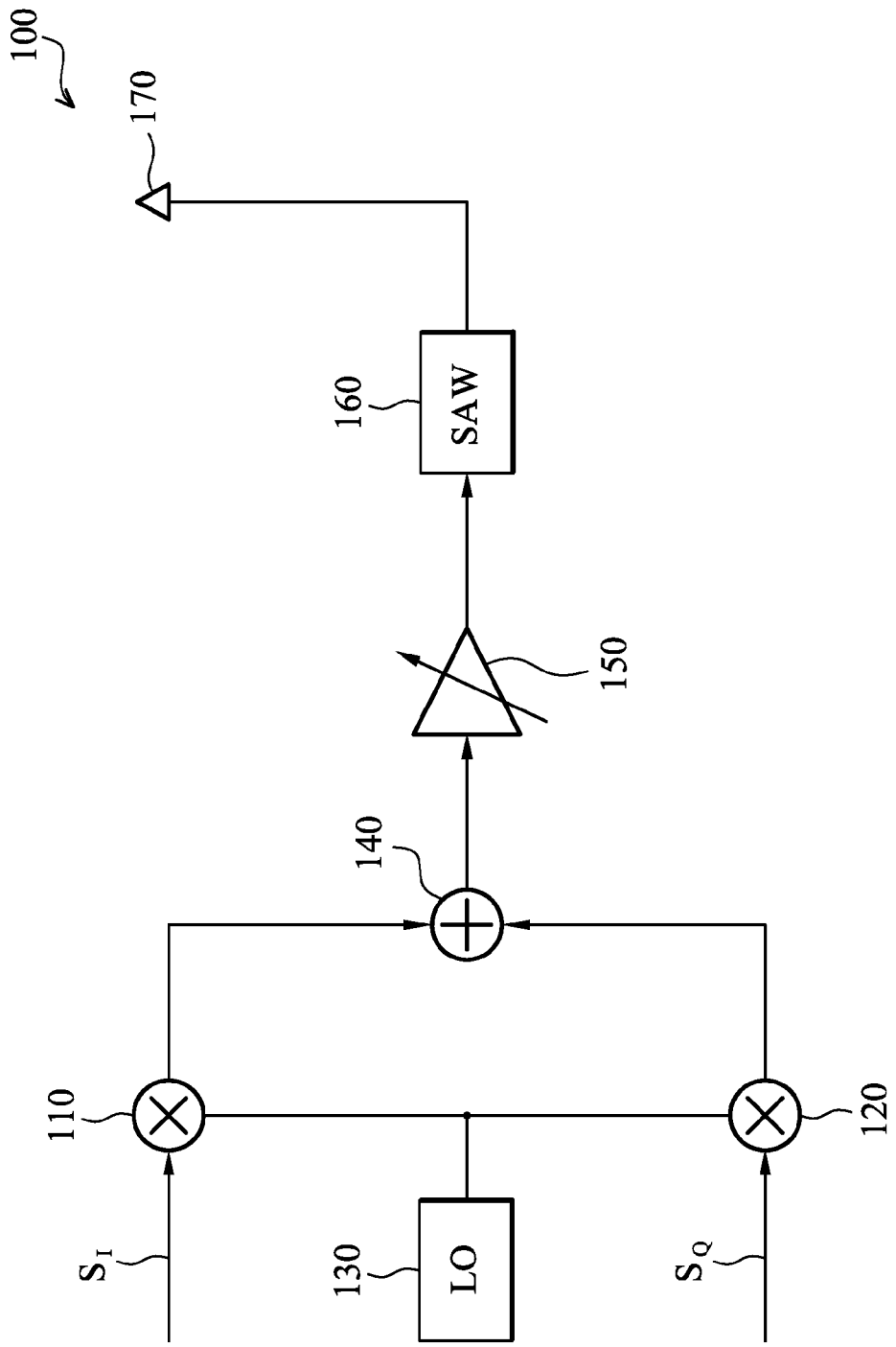
FIG. 1 is a schematic diagram of a conventional transmitter.
Figure 5:
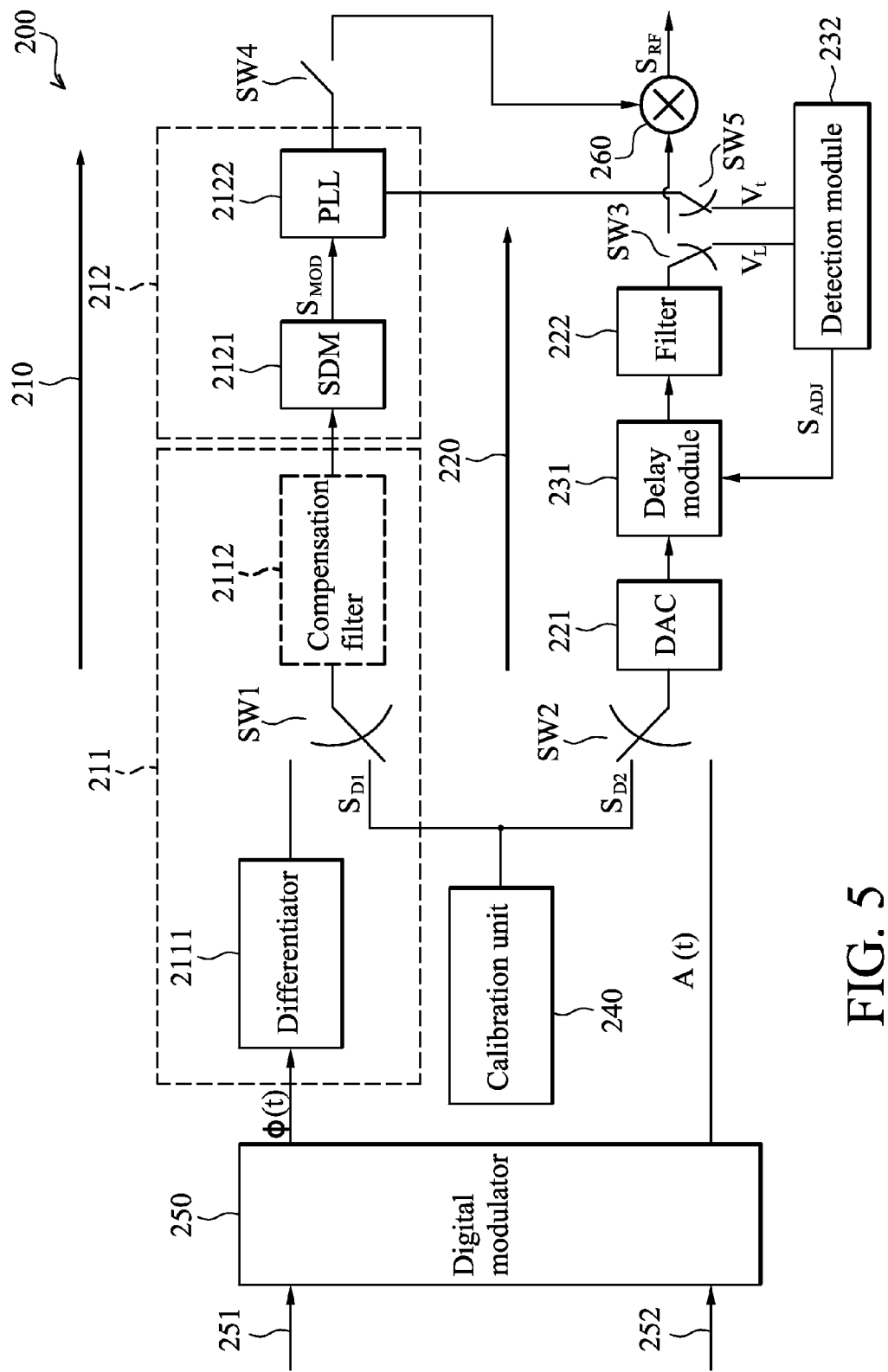
FIGS. 5~7 are schematic diagrams of other exemplary embodiments of the transmitter.
Figure 6:
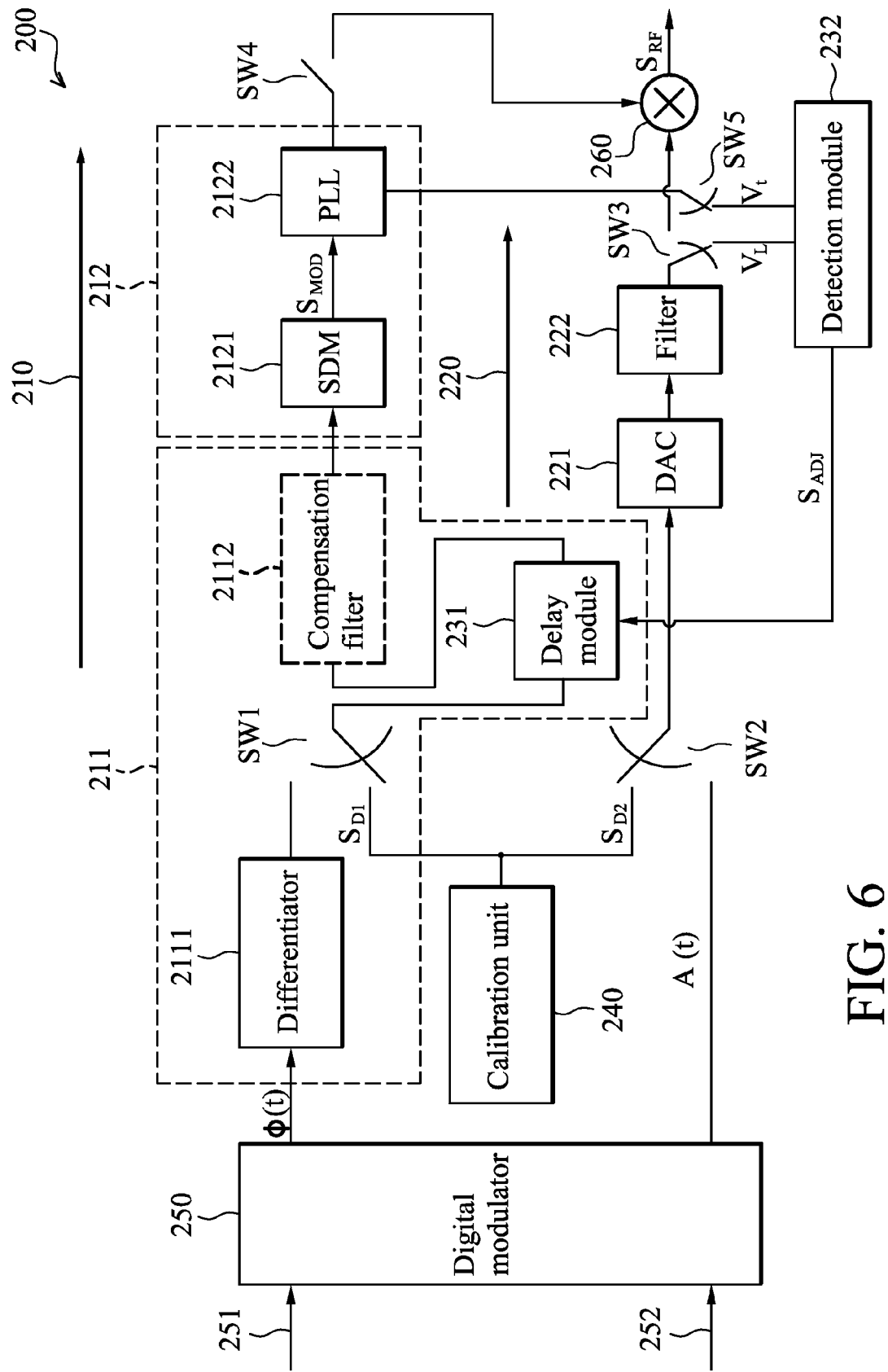
Figure 7:
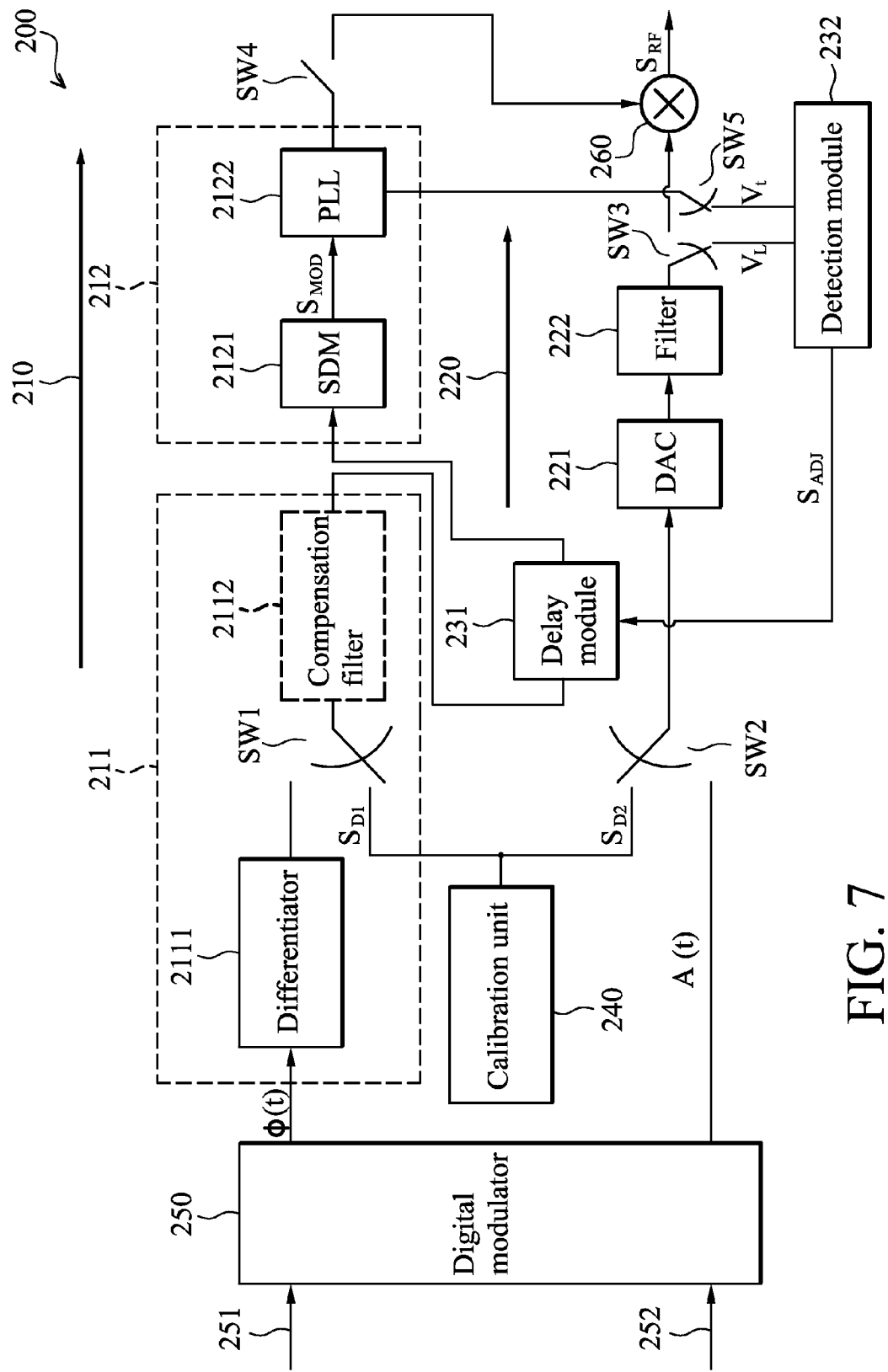

FIGS. 5~7 are schematic diagrams of other exemplary embodiments of the transmitter. FIGS. 5~7 are similar to FIG. 1 except for the position of the delay module 231. Referring to FIG. 5, the delay module 231 is coupled between the DAC 221 and the filter 222. Referring to FIG. 6, the delay module 231 is coupled between the differentiator 2111 and the compensation filter 2112. Referring to FIG. 7, the delay module 231 is coupled between the process unit 211 and the fractional-N PLL 212.

Figure 8:
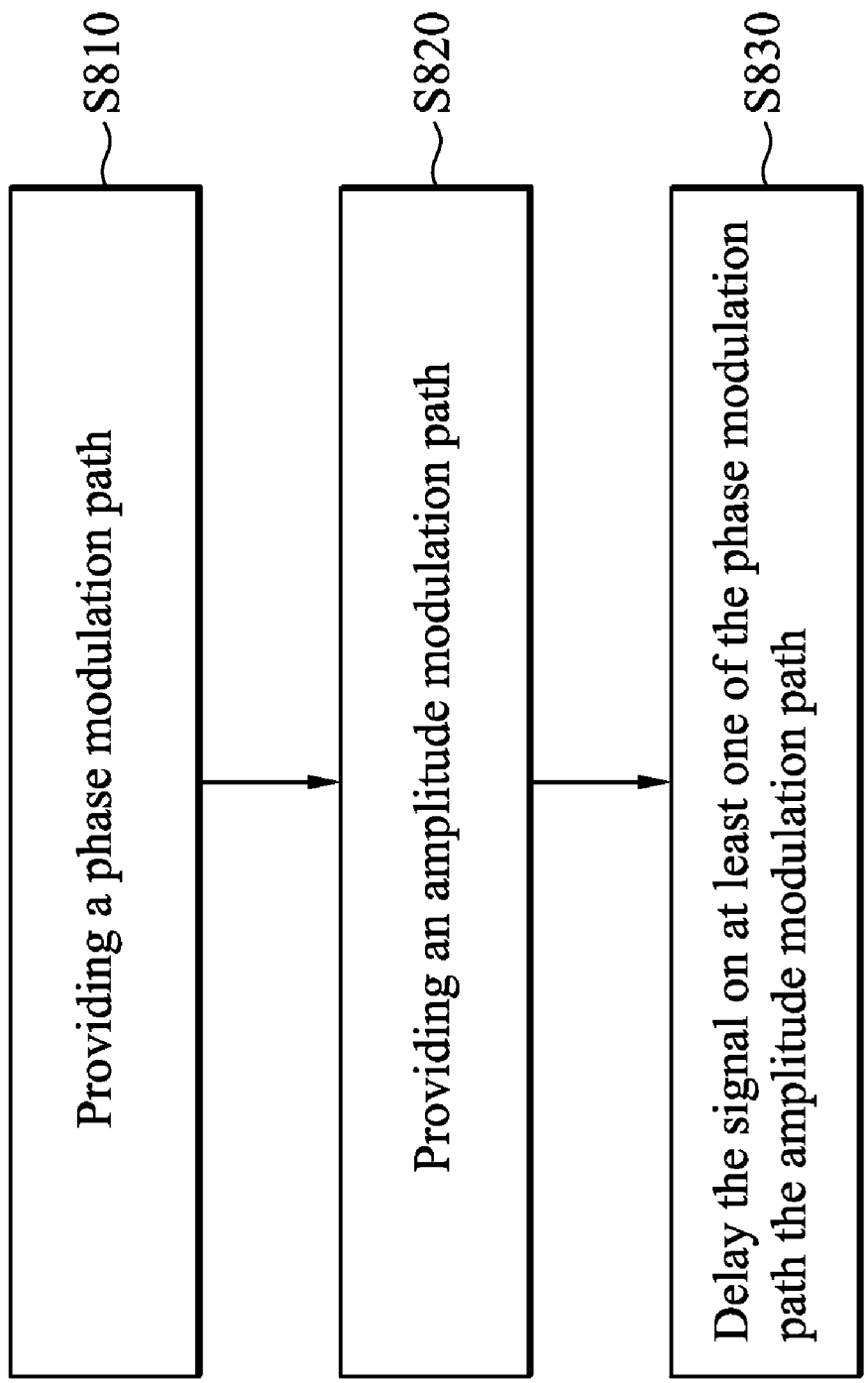
FIG. 8 is a flowchart of an exemplary embodiment of a control method.

FIG. 8 is a flowchart of an exemplary embodiment of a control method. The control method is utilized in a transmitter to transmit and calibrate a phase signal and an amplitude signal. First, a phase modulation path is provided to transmit the phase signal (step S810). An amplitude modulation path is provided to transmit the amplitude signal (step S820). In a calibration mode, a calibration unit provides a first calibration signal and a second calibration signal to the phase modulation path and the amplitude modulation path, respectively.

The signal on at least one of the phase modulation path and the amplitude modulation path is delayed (step S830). The signals on the phase modulation path and the amplitude modulation path may be delayed by the elements of the phase modulation path and the amplitude modulation path. When the phase modulation path and the amplitude modulation path respectively receive a first calibration signal and a second calibration signal, the first calibration signal maybe slower or faster than the second calibration signal. For example, if the second calibration signal is faster than the first calibration signal, the second calibration signal is delayed. Thus, the first and the second calibration signals are synchronous.

Since the signal on the amplitude modulation path is delayed, if a phase signal is provided to the phase modulation path and an amplitude signal is provided to the amplitude modulation path, the phase signal and the amplitude signal are synchronous. In one embodiment, I/Q data is modulated by a phase-amplitude modulator to separate out the phase and the amplitude signals.

Referring to FIG. 2, the control unit 230 is utilized to determine which signal is faster. In the calibration mode, the detection module 232 detects the difference of the first and the second calibration signals and then generates an adjustment signal $S_{ADJ}$ according to the detection result. The delay module 231 delays at least one of the first and the second calibration signals according to the adjustment signal $S_{ADJ}$. In FIGS. 2 and 5, the delay module 231 delays the signal on the amplitude modulation path 220. In FIGS. 6 and 7, the delay module 231 delays the signal on the phase modulation path 210.

When the first and the second calibration signals are synchronous, the detection module 232 stops detecting the difference and maintains the adjustment signal $S_{ADJ}$. Since the delay level of the detection module 232 is maintained, the signals on the phase modulation path 210 and the amplitude modulation path 220 are synchronous.

Generally, when the phase modulation path or the amplitude modulation path comprises a filter. Delay is easily introduced into the filter. Thus, in the calibration mode, the detection module 232 detects the filtered signals. In one embodiment, the detection module 232 transforms the filtered signals into differential pairs and then generates an adjustment signal $S_{ADJ}$ according to the differential pairs.

Since the signals on the phase modulation path and the amplitude modulation path may be delayed by the elements of the phase modulation path and the amplitude modulation path, calibration signals are first provided to the phase modulation path and the amplitude modulation path. Then, the signals on the phase modulation path and the amplitude modulation path are detected to determine which calibration signal is faster. Then, the faster calibration signal is delayed by a delay module such that the calibration signals on the phase modulation path and the amplitude modulation path are synchronous.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transmitter for transmitting and calibrating a phase signal and an amplitude signal, comprising:
   a phase modulation path for transmitting the phase signal;
   an amplitude modulation path for transmitting the amplitude signal;
   a control unit delaying the signal on at least one of the phase modulation path and the amplitude modulation path;
   a calibration unit, wherein when the transmitter is in a calibration mode, the calibration unit is arranged to provide a calibration signal to the phase modulation path and the amplitude modulation path to serve as the phase signal and the amplitude signal; and
   a digital modulator, wherein when the transmitter is in a normal mode, the digital modulator is arranged to modulate I/Q data to provide the phase signal and the amplitude signal to the phase modulation path and the amplitude modulation path, respectively.

2. The transmitter as claimed in claim 1, further comprising a combiner, wherein in the normal mode, the combiner combines the phase signal and the amplitude signal to generate a radio frequency (RF) signal.

3. The transmitter as claimed in claim 1, wherein the control unit comprises:
   a detection module generating an adjustment signal according to a difference between the phase signal and the amplitude signal transmitted in the calibration mode; and
   a delay module delaying the signal on at least one of the phase modulation path and the amplitude modulation path according to the adjustment signal.

4. The transmitter as claimed in claim 3, wherein the phase modulation path comprises a first filter for filtering the signal on the phase modulation path, the amplitude modulation path comprises a second filter for filtering the signal on the amplitude modulation path, and the detection module transforms the filtered signals and generates the adjustment signal according to the transformed results.

5. The transmitter as claimed in claim 4, wherein the detection module comprises:
   a first differential generator transforming the output of first filter to generate a first differential pair;
   a second differential generator transforming the output of second filter to generate a second differential pair;
   a first comparator comparing the first differential pair;
   a second comparator comparing the second differential pair; and
   a flip-flop generating the adjustment signal according to the compared results.

6. The transmitter as claimed in claim 4, wherein the detection module comprises:
   a first voltage generator receiving the output of first filter to generate a first divided signal;
   a second voltage generator receiving the output of second filter to generate a second divided signal;
   a first comparator comparing the output of first filter and the first divided signal;
   a second comparator comparing the output of second filter and the second divided signal; and
   a flip-flop generating the adjustment signal according to the compared results.

7. The transmitter as claimed in claim 4, wherein the phase modulation path comprises:
   a process unit processing the signal on the phase modulation path and outputting a processed result; and
   a fractional-N PLL transforming the processed result.

8. The transmitter as claimed in claim 7, wherein the process unit comprises:
   a differentiator differentiating the phase signal in the normal mode; and
   a compensation filter increasing a high frequency component of the first calibration signal in the calibration mode, and increasing a high frequency component of the differentiated phase signal in the normal mode.

9. The transmitter as claimed in claim 8, wherein the fractional-N PLL comprises:
   a sigma-delta modulator (SDM) modulating the processed result to generate a modulated signal; and
   a phase-locked loop (PLL) executing a phase locked procedure according to the modulated signal.

10. The transmitter as claimed in claim 9, wherein the first filter is disposed in the PLL.

11. The transmitter as claimed in claim 9, wherein the delay module is coupled between the process unit and the fractional-N PLL.

12. The transmitter as claimed in claim 9, wherein the delay module is coupled between the differentiator and the compensation filter.

13. The transmitter as claimed in claim 9, wherein the amplitude modulation path further comprises a digital-to-analog converter (DAC) for transforming the signal on the amplitude modulation path and the second filter filters the transformed result.

14. The transmitter as claimed in claim 13, wherein the delay module is coupled between the DAC and the second filter.

15. A control method for transmitting and calibrating a phase signal and an amplitude signal, comprising:
   providing a phase modulation path for transmitting the phase signal;
   providing an amplitude modulation path for transmitting the amplitude signal; and
   delaying the signal on at least one of the phase modulation path and the amplitude modulation path, wherein in a calibration mode, a first calibration signal serves as the phase signal and a second calibration signal serves as the amplitude signal and in a normal mode, I/Q data is modulated to provide the phase signal and the amplitude signal, and the first and the second calibration signals are the same.

16. The control method as claimed in claim 15, wherein the step of the delaying comprises:
   detecting the difference between the phase signal and the amplitude signal transmitted in the calibration mode; and delaying the signal on at least one of the phase modulation path and the amplitude modulation path according to the detection result.

17. The control method as claimed in claim 16, wherein in the normal mode, detection of the difference between the signals on the phase modulation path and the amplitude modulation path is stopped.

18. The control method as claimed in claim 16, further comprising:
    filtering the signals on the phase modulation path and the amplitude modulation path for generating a first filtered signal and a second filtered signal;
    detecting the difference between the first and the second filtered signals for generating an adjustment signal; and
    delaying the signal on at least one of the phase modulation path and the amplitude modulation path according to the adjustment signal.

19. The control method as claimed in claim 18, further comprising:
    transforming the first and the second filtered signals into a first differential pair and a second differential pair; and
    delaying the signal on at least one of the phase modulation path and the amplitude modulation path according to the first and the second differential pairs.

20. A transmitter for transmitting and calibrating a phase signal and an amplitude signal, comprising:
    a first filter generating the phase signal according to a first signal;
    a second filter generating the amplitude signal according to a second signal;
    a control unit delaying at least one of the first and the second signals;
    a calibration unit providing a first calibration signal to serve as the first signal and providing a second calibration signal to serve as the second signal in a calibration mode, wherein the first and the second calibration signals are the same; and
    a digital modulator modulating I/Q data to generate a first modulated data and a second modulated data, wherein the first modulated data is served as the first signal and the second modulated data is served as the second signal.

21. The transmitter as claimed in claim 20, further comprising a combiner, wherein in the normal mode, the combiner combines the phase signal and the amplitude signal to generate a radio frequency (RF) signal.

22. The transmitter as claimed in claim 20, wherein the control unit comprises:
    a detection module generating an adjustment signal according to the difference between the phase signal and the amplitude signal transmitted in the calibration mode; and
    a delay module delaying at least one of the first and the second signals according to the adjustment signal.

23. The transmitter as claimed in claim 22, wherein the detection module transforms the first and the second calibration signals, and generates the adjustment signal according to the transformed results.

24. The transmitter as claimed in claim 23, wherein the detection module comprises:
    a first differential generator transforming the first calibration signal to generate a first differential pair;
    a second differential generator transforming the second calibration signal to generate a second differential pair;
    a first comparator comparing the first differential pair;
    a second comparator comparing the second differential pair; and
    a flip-flop generating the adjustment signal according to the compared results.

25. The transmitter as claimed in claim 23, wherein the detection module comprises:
    a first voltage generator receiving the first calibration signal to generate a first divided signal;
    a second voltage generator receiving the second calibration signal to generate a second divided signal;
    a first comparator comparing the first calibration signal and the first divided signal;
    a second comparator comparing the second calibration signal and the second divided signal; and
    a flip-flop generating the adjustment signal according to the compared results.

26. The transmitter as claimed in claim 20, further comprising:
    a process unit processing the first signal and outputting a processed result; and
    a fractional-N PLL transforming the processed result.

27. The transmitter as claimed in claim 26, wherein the process unit comprises:
    a differentiator differentiating the first signal in the normal mode; and
    a compensation filter increasing a high frequency component of the first calibration signal in the calibration mode, and increasing a high frequency component of the differentiated first signal in the normal mode.

28. The transmitter as claimed in claim 26, wherein the fractional-N PLL comprises:
    a sigma-delta modulator (SDM) modulating the processed result to generate a modulated signal; and
    a phase-locked loop (PLL) executing a phase locked procedure according to the modulated signal, wherein the first filter is integrated with the PLL.

29. The transmitter as claimed in claim 26, wherein a delay module is coupled between the process unit and the fractional-N PLL.

30. The transmitter as claimed in claim 27, wherein a delay module is coupled between the differentiator and the compensation filter.

31. The transmitter as claimed in claim 26, further comprising a digital-to-analog converter (DAC) for transforming the second signal and providing the transformed result to the second filter.

32. The transmitter as claimed in claim 31, wherein the delay module is coupled between the DAC and the second filter.

* * * * *